(12) United States Patent
Kosier et al.

(10) Patent No.: US 9,735,345 B2
(45) Date of Patent: Aug. 15, 2017

(54) VERTICAL HALL EFFECT SENSOR

(71) Applicant: Allegro Microsystems, LLC, Worcester, MA (US)

(72) Inventors: Steven Kosier, Lakeville, MN (US); Noel Hoilien, Minneapolis, MN (US)

(73) Assignee: Allegro MicroSystems, LLC, Worcester, MA (US)

( * ) Notice: Subject to any disclaimer, the term of this patent is extended or adjusted under 35 U.S.C. 154(b) by 0 days.

(21) Appl. No.: 15/060,791

(22) Filed: Mar. 4, 2016

(65) Prior Publication Data

US 2016/0190433 A1    Jun. 30, 2016

Related U.S. Application Data

(63) Continuation of application No. 14/041,063, filed on Sep. 30, 2013, now Pat. No. 9,312,473.

(51) Int. Cl.
*H01L 27/22* (2006.01)
*H01L 43/06* (2006.01)
(Continued)

(52) U.S. Cl.
CPC .......... *H01L 43/065* (2013.01); *G01R 33/077* (2013.01); *H01L 27/22* (2013.01); *H01L 43/04* (2013.01); *H01L 43/14* (2013.01)

(58) Field of Classification Search
CPC ....... H01L 43/06; H01L 43/065; H01L 43/14; H01L 27/22; H01L 43/04
See application file for complete search history.

(56) References Cited

U.S. PATENT DOCUMENTS 4,634,961 A    1/1987  Popovic et al.
4,668,914 A    5/1987  Kersten et al.
(Continued)

FOREIGN PATENT DOCUMENTS

DE    10 2005 014 509 B4    10/2006
DE    10 2006 017 910 A1    10/2007
(Continued)

OTHER PUBLICATIONS

Allegro Microsystems, Inc.; "High Precision 2-Wire Linear Hall Effect Sensor IC with Pulse Width Modulated Output;" A1354 Data Sheet; 22 Pages.
(Continued)

*Primary Examiner* — Thanh Y Tran
(74) *Attorney, Agent, or Firm* — Daly, Crowley, Mofford & Durkee, LLP

(57) ABSTRACT

In one aspect, a vertical Hall effect sensor includes a semiconductor wafer having a first conductivity type and a plurality of semiconductive electrodes disposed on the semiconductor wafer. The plurality of semiconductive electrodes have the first conductivity type and include a source electrode, a first sensing electrode and a second sensing electrode, arranged such that the source electrode is between the first sensing electrode and the sensing electrode and a first drain electrode and a second drain electrode, arranged such that the first sensing electrode, second sensing electrode, and source electrode are between the first drain electrode and the second drain electrode. The vertical Hall effect sensor also includes a plurality of semiconductor fingers disposed on the semiconductor wafer and interdigitated with the plurality of semiconductive electrodes, the semiconductor fingers having a second conductivity type.

13 Claims, 5 Drawing Sheets

(51) Int. Cl.
*G01R 33/07* (2006.01)
*H01L 43/14* (2006.01)
*H01L 43/04* (2006.01)

(56) References Cited

U.S. PATENT DOCUMENTS

| | | |
|---|---|---|
| 4,761,569 A | 8/1988 | Higgs |
| 4,829,352 A | 5/1989 | Popovic et al. |
| 4,970,411 A * | 11/1990 | Halg .................. H01L 27/22 257/423 |
| 5,541,506 A | 7/1996 | Kawakita et al. |
| 5,572,058 A * | 11/1996 | Biard ................ H01L 27/22 257/421 |
| 5,612,618 A | 3/1997 | Arakawa |
| 5,619,137 A | 4/1997 | Vig et al. |
| 5,621,319 A | 4/1997 | Bilotti et al. |
| 5,657,189 A | 8/1997 | Sandhu |
| 5,694,038 A | 12/1997 | Moody et al. |
| 5,831,513 A | 11/1998 | Lue |
| 5,844,411 A | 12/1998 | Vogt |
| 5,942,895 A | 8/1999 | Popovic et al. |
| 6,064,199 A | 5/2000 | Walter et al. |
| 6,064,202 A | 5/2000 | Steiner et al. |
| 6,091,239 A | 7/2000 | Vig et al. |
| 6,100,680 A | 8/2000 | Vig et al. |
| 6,166,535 A | 12/2000 | Irle et al. |
| 6,232,768 B1 | 5/2001 | Moody et al. |
| 6,236,199 B1 | 5/2001 | Irle et al. |
| 6,265,864 B1 | 7/2001 | De Winter et al. |
| 6,288,533 B1 | 9/2001 | Haeberli et al. |
| 6,297,627 B1 | 10/2001 | Towne et al. |
| 6,356,741 B1 | 3/2002 | Bilotti et al. |
| 6,525,531 B2 | 2/2003 | Forrest et al. |
| 6,542,068 B1 | 4/2003 | Drapp et al. |
| 6,545,462 B2 | 4/2003 | Schott et al. |
| 6,622,012 B2 | 9/2003 | Bilotti et al. |
| 6,768,301 B1 | 7/2004 | Hohe et al. |
| 6,969,988 B2 | 11/2005 | Kakuta et al. |
| 7,030,606 B2 | 4/2006 | Kato et al. |
| 7,038,448 B2 | 5/2006 | Schott et al. |
| 7,085,119 B2 | 8/2006 | Bilotti et al. |
| 7,119,538 B2 | 10/2006 | Blossfeld |
| 7,159,556 B2 | 1/2007 | Yoshihara |
| 7,235,968 B2 | 6/2007 | Popovic et al. |
| 7,259,556 B2 | 8/2007 | Popovic et al. |
| 7,307,824 B2 | 12/2007 | Bilotti et al. |
| 7,362,094 B2 | 4/2008 | Voisine et al. |
| 7,714,570 B2 | 5/2010 | Thomas et al. |
| 7,746,065 B2 | 6/2010 | Pastre et al. |
| 7,759,929 B2 | 7/2010 | Forsyth |
| 7,872,322 B2 | 1/2011 | Schott et al. |
| 7,911,203 B2 | 3/2011 | Thomas et al. |
| 7,965,076 B2 | 6/2011 | Schott |
| 7,994,774 B2 | 8/2011 | Thomas et al. |
| 9,099,638 B2 | 8/2015 | Wang et al. |
| 9,312,473 B2 | 4/2016 | Kosier et al. |
| 2004/0207031 A1 | 10/2004 | Berndt et al. |
| 2005/0230770 A1 | 10/2005 | Oohira |
| 2006/0011999 A1 | 1/2006 | Schott et al. |
| 2006/0164080 A1 * | 7/2006 | Popovic ............... G01R 33/06 324/244 |
| 2007/0267709 A1 | 11/2007 | Oohira |
| 2007/0290682 A1 | 12/2007 | Oohira et al. |
| 2009/0051351 A1 * | 2/2009 | Forsyth ................ G01D 5/145 324/207.2 |
| 2009/0121707 A1 | 5/2009 | Schott |
| 2009/0174395 A1 | 7/2009 | Thomas et al. |
| 2009/0295375 A1 | 12/2009 | Oohira |
| 2010/0134101 A1 * | 6/2010 | Riva .................... G01R 33/07 324/251 |
| 2010/0156397 A1 | 6/2010 | Yabusaki et al. |
| 2010/0164491 A1 | 7/2010 | Kejik et al. |
| 2010/0207222 A1 | 8/2010 | Wang |
| 2010/0219810 A1 | 9/2010 | Rocznik et al. |
| 2010/0252900 A1 | 10/2010 | Minixhofer et al. |
| 2011/0204460 A1 | 8/2011 | Wong et al. |
| 2011/0248708 A1 | 10/2011 | Thomas et al. |
| 2012/0001279 A1 | 1/2012 | Hioka et al. |
| 2012/0313635 A1 | 12/2012 | Daubert |
| 2013/0021026 A1 | 1/2013 | Ausserlechner |
| 2013/0021027 A1 | 1/2013 | Ausserlechner |
| 2013/0057257 A1 | 3/2013 | Friedrich et al. |
| 2014/0210023 A1 | 7/2014 | Wang |
| 2015/0091112 A1 | 4/2015 | Kosier et al. |

FOREIGN PATENT DOCUMENTS

| | | |
|---|---|---|
| DE | 10 2006 037 226 A1 | 2/2008 |
| EP | 0 671 773 A2 | 9/1995 |
| EP | 0 631 416 B1 | 9/2002 |
| EP | 0 916 074 B1 | 7/2003 |
| EP | 0 875 733 B1 | 3/2004 |
| EP | 2 000 814 A2 | 12/2008 |
| EP | 2 234 185 A1 | 9/2010 |
| EP | 2 503 612 A2 | 9/2012 |
| JP | 58-055688 A | 10/1987 |
| JP | 2003-042709 A | 2/2003 |
| JP | 2005-241269 A | 9/2005 |
| JP | 2007-027515 A | 2/2007 |
| JP | 2007-147460 A | 6/2007 |
| JP | 2010-014607 A | 1/2010 |
| JP | 2010-078366 A | 4/2010 |
| WO | WO 98/10302 | 3/1998 |
| WO | WO 98/54547 | 12/1998 |
| WO | WO 00/02266 | 1/2000 |
| WO | WO 03/036732 A2 | 5/2003 |
| WO | WO 2004/025742 A1 | 3/2004 |
| WO | WO 2006/056289 A1 | 6/2006 |
| WO | WO 2006/074989 A2 | 7/2006 |
| WO | WO 2008/145662 A1 | 12/2008 |
| WO | WO 2009/124969 A1 | 10/2009 |

OTHER PUBLICATIONS

Allegro Microsystems, Inc.; "High Precision Linear Hall-Effect Sensor with an Open Drain Pulse Width Modulated Output;" A1356 Data Sheet; 20 Pages.

Allegro Microsystems, Inc.; "Sensitive Two-Wire Chopper-Stabilized Unipolar Hall-Effect Switches;" A1140/41/42/43 Data Sheet; Published Sep. 9, 2004; 11 Pages.

Allegro Microsystems, Inc.; "Ultrasensitive Hall Effect Latch with Internally or Externally Controlled Sample and Sleep Periods for Track Ball and Scroll Wheel Applications;" A1174 Data Sheet; Published Jul. 25, 2008; 13 Pages.

Allegro Microsystems, Inc.; "Ultra-Sensitive Dual-Channel Quadrature Hall-Effect Bipolar Switch;" A1230 Data Sheet; Published Mar. 26, 2010; 16 Pages.

Allegro Microsystems, Inc.; "High Precision Linear Hall Effect Sensor with a Push/Pull, Pulse Width Modulated Output;" A1351 Data Sheet; Published Mar. 7, 2008; 23 Pages.

Allegro Microsystems, Inc.; "Low-Noise Programmable Linear Hall Effect Sensors with Adjustable Bandwidth (50 kHz Maximum) and Analog Output;" A1360, A1361 and A1362 Data Sheets; Published Mar. 18, 2008; 25 Pages.

Allegro Microsystems, Inc.; "Micropower, Ultra-Sensitive Hall-Effect Switch;" A3212 Data Sheet; Published Sep. 22, 2004; 12 Pages.

Allegro Microsystems, Inc.; "Self-Calibrating TPOS Speed Sensor IC Optimized for Automotive Cam Sensing Applications;" ATS675LSE Data Sheet; Published Jul. 11, 2008; 13 Pages.

Allegro Microsystems, Inc.; "Hall-Effect IC Applications Guide;" 27701-AN Data Sheet; Application Information, Rev. 2; Retrieved on Sep. 29, 2010 from <http://www.allegromicro.com/en/products/design/hall-effect-sensor-ic-applications-guide/AN27701.pdf>; 40 Pages.

Allegro Microsystems, Inc.; "Dual-Output Hall-Effect Switch;" A3235—Data Sheet 27633A; Retrieved on Sep. 29, 2010 from <http://www.datasheetcatalog.org/datasheets/90/205047_DS.pdf>; 6 Pages.

(56) References Cited

OTHER PUBLICATIONS

Allegro Microsystems, Inc.; "Dual, Chopper-Stabilized, Ultra-Sensitive, Bipolar Hall-Effect Switch;" A3425 Data Sheet; Published Jun. 28, 2002; 10 Pages.
Austria Microsystems; "10-Bit Programmable Magnetic Rotary Encoder;" AS5040 Data Sheet; Revision 1.1; Jan. 2004; 20 Pages.
MEMSIC Corporation; AN-00MM-001; "Magnetometer Fundamentals;" Jun. 2008; 6 Pages.
MEMSIC Corporation; AN-00MM-002; "Magnetometer Soldering Methodology;" Jun. 2008; 2 Pages.
MEMSIC Corporation; AN-00MM-003; "Magnetic Sensor Calibration;" Mar. 2008; 5 Pages.
MEMSIC Corporation; AN-00MM-004; "Electronic Tilt Compensation;" Mar. 2008; 5 Pages.
MEMSIC Corporation; AN-00MM-005; "Magnetic Sensor Placement Guidelines;" Oct. 2008; 2 Pages.
MEMSIC Corporation; MMC312xMQ Preliminary; "Tri-axis Magnetic Sensor, with $I^2C$ Interface;" Aug. 14, 2008; 9 Pages.
MEMSIC Corporation; MMC314xMS Revision A; "Ultra Small 3-axis Magnetic Sensor, with $I^2C$ Interface;" Mar. 31, 2010; 8 Pages.
Atherton; "Sensor Signal Conditioning—an IC Designer's Perspective;" IEEE Electro International; Apr. 26-28, 1991; pp. 129-134; 6 Pages.
Banjevic et al; "2D CMOS Integrated Magnetometer Based on the Miniaturized Circular Vertical Hall Device;" International Solid-State Sensors, Actuators and Microsystems Conference; Transducers; Jun. 21-25, 2009; pp. 877-880; 4 Pages.
Banjevic; "High Bandwidth CMOS Magnetic Sensors Based on the Miniaturized Circular Vertical Hall Device;" Sep. 2011; 153 Pages.
Baschirotto et al.; "Development and Analysis of a PCB Vector 2-D Magnetic Field Sensor System for Electronic Compasses;" IEEE Sensors Journal, vol. 6, No. 2; Apr. 2006; pp. 365-371; 7 Pages.
Blanchard et al.; "Cylindrical Hall Device;" International Electron Devices Meeting; Dec. 8-11, 1996; pp. 541-544; 4 Pages.
Burger et al.; "New fully integrated 3-D silicon Hall sensor for precise angular-position measurements;" Sensors and Actuators, A 67; May 1998; pp. 72-76; 5 Pages.
Drljaca, et al.; "Nonlinear Effects in Magnetic Angular Position Sensor With Integrated Flux Concentrator;" Proc. $23^{rd}$ International Conference on Microelectronics (MIEL 2002); vol. 1; May 12-15, 2002; pp. 223-226; 4 Pages.
Dwyer; "Ring Magnet Speed Sensing for Electronic Power Steering;" Allegro Microsystems, Inc.: AN296061; Published Jul. 21, 2009; 4 Pages.
Freitas et al.; "Giant magnetoresistive sensors for rotational speed control;" Journal of Applied Physics, vol. 85, No. 8; Apr. 15, 1999; pp. 5459-5461; 3 Pages.
Gerhauser; "Intelligente 3D-Magnetfeldsnesorik;" Fraunhofer-Institut for Integrierte Schaltungen IIS; www.iis.fraunhofer.de/asic/analog; Oct. 2009; 12 Pages.
Gilbert; "Technical Advances in Hall-Effect Sensing;" Allegro Microsystems, Inc. Product Description; May 10, 2008; 7 Pages.
Häberli et al.; "Contactless Angle Measurement by CMOS Magnetic Sensor with on Chip Read-Out Circuit;" The $8^{th}$ International Conference on Solid-State Sensors and Actuators, and Eurosensors IX; Jun. 25-29, 1995; pp. 134-137; 4 Pages.
Häberli et al.; "Two-Dimensional Magnetic Microsensor with On-Chip Signal Processing for Contactless Angle Measurement;" IEEE Journal of Solid-State Circuits, vol. 31, No. 12; Dec. 1996; pp. 1902-1907; 6 Pages.
Hiligsmann et al.; "Monolithic 360 Degrees Rotary Position Sensor IC;" 2004 IEEE Proceedings of Sensors, vol. 3; Oct. 24-27, 2004; pp. 1137-1142; 6 Pages.
Kaufmann et al.; "Novel Coupling Concept for Five-Contact Vertical Hall Devices;" 16th International Solid-State Sensors, Actuators and Microsystems (Transducers) Conference; Jun. 5-9, 2011; 4 Pages.

Kejik et al.; "Circular Hall Transducer for Angular Position Sensing;" International Solid-State Sensors, Actuators and Microsystems (Transducers) Conference; Jun. 2007; pp. 2593-2596; 4 Pages.
Kejik, et al.; "Purley CMOS Angular Position Sensor Based on a New Hall Microchip;" $34^{th}$ Annual Conference of IEEE Industrial Electronics (IECON); Nov. 10-13, 2008; pp. 1777-1781; 5 Pages.
Kejik,.et al.; "Ultra Low-Power Angular Position Sensor for High-Speed Portable Applications;" 2009 IEEE Sensors Conference; Oct. 25-28, 2009; pp. 173-176; 4 Pages.
Law; "Anglular Position Sensing with 2-Axis Hall ICs;" Sensors Magazine, vol. 20, No. 3; Mar. 2003; 7 Pages.
Masson et al.; "Multiturn and high precision through-shaft magnetic sensors;" Sensor+Test Conference; Proceedings II; May 2009; pp. 41-46; 6 Pages.
Melexis Microelectronic Integrated Systems; "Triaxis 3D-Joystick Position Sensor;" MLX90333 Data Sheet; Mar. 2009; 43 Pages.
Melexis Microelectronic Integrated Systems; ""Under-the-Hood" Triaxis Rotary Position feat. SENT Protocol;" MLX 90324 Data Sheet; Dec. 2008; 40 Pages.
Metz et al.; "Contactless Angle Measurement Using Four Hall Devices on Single Chip;"; International Conference on Solid-State Sensors and Actuators; Transducers; vol. 1; Jun. 16-19, 1997; 4 Pages.
Micronas; "HAL® 3625 Programmable Direct Angle Sensor;" Product Information; Sep. 2009; 2 Pages.
Munter; "A Low-offset Spinning-current Hall Plate;" Sensors and Actuators, vol. A21-A23; Jan. 1990; pp. 743-746; 4 Pages.
Novotechnik Siedle Group; "How New Angular Positioning Sensor Technology Opens a Broad Range of New Applications;" Vert-X Technology; Dec. 2001; 5 Pages.
Paranjape et al., "A CMOS-Compatible 2-D Vertical Hall Magnetic-Field Sensor Using Active Carrier Confinement and Post-Process Micromachining;" IEEE Sensors and Actuators, vol. 53, No. 1; May 1996; 6 Pages.
Petoussis et al.; "A Novel Hall Effect Sensor Using Elaborate Offset Cancellation Method;" Sensors & Transducers Journal, vol. 100, Issue 1; Jan. 2009; pp. 85-91; 7 Pages.
Popovic; "Not-plate-like Hall magnetic sensors and their applications;" Sensors and Actuators, vol. 85, Issues 1-3; Aug. 2000; pp. 9-17; 9 Pages.
Reymond et al., "True 2D CMOS Integrated Hall Sensor;" IEEE Sensors 2007 Conference; Oct. 28-31, 2007; 4 Pages.
Roumenin et al.; "Vertical Hall Effect Devices in the Basis of Smart Silicon Sensors;" IEEE Workshop on Intelligent Data Acquisition and Advanced Computing Systems: Technology and Applications; Sep. 5-7, 2005; pp. 55-58; 4 Pages.
Roumenin; "Magnetic sensors continue to advance towards perfection;" Sensors and Actuators, vol. 46-47, Issues 1-3; Jan. 1995; pp. 273-279; 7 Pages.
Schneider et al.; "Temperature Calibration of CMOS Magnetic Vector Probe for Contactless Angle Measurement System;" International Electron Devices Meeting; Dec. 8-11, 1996; 4 Pages.
Sensima Technology sa; "CVHD: a new concept of Angular Position Sensor;" Slideshow Presentation for Allegro Microsystems; Mar. 2009; 17 Pages.
Sentron, a Melexis Company; "Angular position sensing with 2-Axis Hall IC 2SA-10;" AN-101; Feb. 12, 2004; <http://www.diegm.uniud.it/petrella/Azionamenti%20Elettrici%20II/Sensori%20e%20trasduttori/Data%20Sheet%20-%202SA-10.pdf>; 7 Pages.
van der Meer et al.; "CMOS quad spinning-current Hall-sensor system for compass application;" IEEE Proceedings of Sensors, vol. 3; Oct. 24-27, 2004; pp. 1434-1437; 4 Pages.
Vogelgesang et al.; "GMR sensors in automotive application;" CS-SNS/ECS Slideshow Presentation for Robert Bosch GmbH; Mar. 2, 2005; 16 Pages.
Volder, "The CORDIC Trigonometric Computing Technique;" The Institute of Radio Engineers, Inc.; IRE Transactions on Electronic Computers, vol. EC, Issue 3; Sep. 1959; pp. 226-230; 5 Pages.
PCT International Search Report and Written Opinion dated Apr. 15, 2014 for PCT Patent Application No. PCT/US2014/011773; 8 Pages.

(56) References Cited

OTHER PUBLICATIONS

PCT International Preliminary Report dated Sep. 24, 2015 for PCT Patent Application No. PCT/US2014/011773; 6 Pages.
PCT International Search Report and Written Opinion dated Jan. 21, 2014 for PCT Patent Application No. PCT/US2013/064237; 21 Pages.
PCT International Preliminary Report dated Aug. 13, 2015 for PCT Patent Application No. PCT/US2013/064237; 16 Pages.
PCT International Search Report and Written Opinion dated Dec. 16, 2014 for Patent Appl. No. PCT/US2014/053826; 14 Pages.
Taiwan Office Action and Search Report (with English Translation) dated Apr. 21, 2015 for Taiwan Pat. App. No. 102137325; 17 Pages.
Email and Response to Office Action (including Specification and Claims in English) from Taiwan International Patent & Law Office dated Jul. 22, 2015 for Taiwan Pat. App. No. 102137325; 15 Pages.
Taiwan Voluntary Amendment (including Specification and Amended Claims in English) filed on Sep. 16, 2015 for Taiwanese Pat. App. No. 102137325; 11 Pages.
Email and Allowance Decision of Examination dated Oct. 29, 2015 for Taiwanese Pat. App. No. 102137325; 4 Pages.
European Patent Office Rule 161 dated Aug. 7, 2015 for European Pat. App. No. 13780484.5-1560; 2 Pages.
Taiwan Office Action (with English Translation) dated Aug. 5, 2015 for Taiwan Patent Application No. 103102458; 22 Pages.
Response to Taiwan Office Action dated Aug. 5, 2015 for Taiwan Application No. 103102458; Response filed on Nov. 5, 2015; 49 Pages.
Office Action dated Jan. 30, 2014 for U.S. Appl. No. 13/752,681; 22 Pages.
Response to Office Action dated Jan. 30, 2014 corresponding to U.S. Appl. No. 13/752,681; Response filed on Apr. 29, 2014; 23 Pages.
Response to Office Action dated Jun. 19, 2014 for U.S. Appl. No. 13/752,681; Response filed on Sep. 19, 2014; 12 Pages.
Final Office Action dated Dec. 4, 2014 for U.S. Appl. No. 13/752,681; 40 Pages.
Office Action dated Aug. 13, 2015 for U.S. Appl. No. 13/752,681; 48 Pages.
Response to Office Action dated Aug. 13, 2015 for U.S. Appl. No. 13/752,681; Response filed on Sep. 15, 2015; 11 Pages.
Final Office Action dated Dec. 31, 2015 for U.S. Appl. No. 13/752,681; 59 Pages.
Office Action dated Sep. 2, 2014 for U.S. Appl. No. 13/836,869; 12 Pages.
Final Office Action dated Mar. 26, 2015 corresponding to U.S. Appl. No. 13/836,869; 31 Pages.
Response to Final Office Action dated Mar. 26, 2015 corresponding to U.S. Appl. No. 13/836,869; Response filed on May 5, 2015; 7 Pages.
Notice of Allowance dated May 29, 2015 corresponding to U.S. Appl. No. 13/836,869; 8 Pages.
Restriction Requirement dated Oct. 24, 2014 for U.S. Appl. No. 14/041,063; 8 Pages.
Response to Restriction Requirement dated Oct. 24, 2014 for U.S. Appl. No. 14/041,063; Response filed Nov. 18, 2014; 1 Page.
Office Action dated Dec. 18, 2014 for U.S. Appl. No. 14/041,063; 30 Pages.
Response to Office Action dated Dec. 18, 2014 for U.S. Appl. No. 14/041,063; Response filed May 18, 2015; 17 Pages.
Office Action dated Sep. 17, 2015 for U.S. Appl. No. 14/041,063; 20 Pages.
Response to Office Action dated Sep. 17, 2015 for U.S. Appl. No. 14/041,063; Response filed Jan. 7, 2016; 6 Pages.
Notice of Allowance dated Feb. 2, 2016 for U.S. Appl. No. 14/041,063; 13 Pages.
Office Action dated Jun. 19, 2014 for U.S. Appl. No. 13/752,681; 31 Pages.
Request for Continued Examination (RCE) with Response to Final Office Action dated Dec. 4, 2014 for U.S. Appl. No. 13/752,681; RCE and Response filed on Apr. 6, 2015; 17 Pages.
Restriction Requirement dated Mar. 13, 2014 for U.S. Appl. No. 13/836,869; 8 Pages.
Response to Restriction Requirement dated Mar. 13, 2014 for U.S. Appl. No. 13/836,869; Response filed May 13, 2014; 3 Pages.
Response to Office Action dated Sep. 2, 2014 for U.S. Appl. No. 13/836,869; Response filed Dec. 1, 2014; 27 Pages.
Response to European Patent Office Rule 161 dated Aug. 7, 2015 for European Pat. App. No. 13780484.5-1560; Response filed on Feb. 17, 2016; 5 Pages.
PCT International Preliminary Report dated Apr. 5, 2016 corresponding to International Application No. PCT/US2014/053826; 8 Pages.
Taiwan Notice of Allowance (with Reporting Email) dated Apr. 13, 2016 for Taiwan Application No. 103102458; 4 Pages.
Notice of Appeal filed on Mar. 30, 2016 for U.S. Appl. No. 13/752,681; 2 Pages.
Appeal Brief filed on May 24, 2016 for U.S. Appl. No. 13/752,681; 16 Pages.
European Intention to Grant dated May 25, 2016 w/Allowed Specification and Claims for European Patent Application No. 13780484. 5; 36 Pages.
Notice of Allowance dated May 25, 2016; for European Pat. App. No. 13780484.5; 6 pages.
Allowed Specification with figures dated May 25, 2016; for European Pat. App. No. 13780484.5; 30 pages.
Response dated Apr. 21, 2016 to European Office Action dated Oct. 15, 2015; for European Pat. App. No. 14702402.0; 4 pages.
Amended Specification, Claims, and Drawings dated Apr. 21, 2016; For European Pat. App. No. 14702402.0; 27 pages.
U.S. Appl. No. 15/370,107, filed Dec. 6, 2016, Wang.
European Communication Pursuant to Rules 161(1) and 162 EPC dated Apr. 13, 2016 corresponding to European Application No. 14766613.5; 2 Pages.
U.S. Notice of Allowance dated Sep. 28, 2016 corresponding to U.S. Appl. No. 13/752,681; 13 Pages.
$2^{nd}$ U.S. Notice of Allowance dated Nov. 4, 2016 corresponding to U.S. Appl. No. 13/752,681; 10 Pages.
Response (with Amended Claims and Specifications) to European Office Action dated Dec. 1, 2016 for European Application No. 14766613.5; Response filed on Feb. 13, 2017; 14 Pages.

* cited by examiner

VERTICAL HALL EFFECT SENSOR

RELATED APPLICATION

This application is a continuation application of U.S. patent application Ser. No. 14/041,063, filed on Sep. 30, 2013 and entitled "VERTICAL HALL EFFECT SENSOR," which is incorporated herein by reference in its entirety.

BACKGROUND

The Hall effect is a phenomenon whereby moving charged particles are deflected by a magnetic field within a charge carrier. This phenomenon has been put to practical use in Hall effect sensors utilizing a current through a semiconductor. The preferable current path in the semiconductor is modified by magnetic fields through the wafer. By detecting the preferred current path, the direction and magnetic field through the semiconductor wafer may be determined.

In practice, many Hall effect sensors use silicon wafers doped to create N-type or P-type semiconductors. Vertical Hall effect sensors are so called because they are used to measure magnetic fields in the plane of the wafer. In practice, many vertical Hall effect detectors employ multiple Hall effect sensors on a single semiconductor substrate, in order to more accurately detect the direction and magnitude of a magnetic field passing through the substrate.

SUMMARY

In one aspect, a vertical Hall effect sensor includes a semiconductor wafer having a first conductivity type and a plurality of semiconductive electrodes disposed on the semiconductor wafer. The plurality of semiconductive electrodes have the first conductivity type and include a source electrode, a first sensing electrode and a second sensing electrode, arranged such that the source electrode is between the first sensing electrode and the sensing electrode and a first drain electrode and a second drain electrode, arranged such that the first sensing electrode, second sensing electrode, and source electrode are between the first drain electrode and the second drain electrode. The vertical Hall effect sensor also includes a plurality of semiconductor fingers disposed on the semiconductor wafer and interdigitated with the plurality of semiconductive electrodes, the semiconductor fingers having a second conductivity type.

In another aspect, a magnetic field sensing device includes a plurality of vertical Hall effect sensors interdigitated between electrodes of the Hall effect sensor. Each vertical Hall effect sensor includes electrically floating semiconductor fingers and the plurality of vertical Hall effect sensors are arranged in a toroid within a semiconductor wafer.

In a further aspect, a method of making a vertical Hall effect sensor, includes forming an epitaxial layer of a semiconductor with a first conductivity type on a semiconductor substrate with a second conductivity type, selectively doping at least five electrodes with the first conductivity type on a surface of the epitaxial layer, selectively doping at least four semiconductor fingers that are interdigitated with the at least five electrodes, the at least four semiconductor fingers having the second conductivity type and selectively doping at least one blanket region with the first conductivity type within the epitaxial layer.

DETAILED DESCRIPTION

Described herein are techniques to detect magnetic fields in the plane of a semiconductor wafer. Due to advances in semiconductor technology, very small devices are capable of being made relatively quickly and easily. The underlying physics of the Hall effect is understood, but creating high output and linearity of that output remains a technological challenge.

Figure 1:
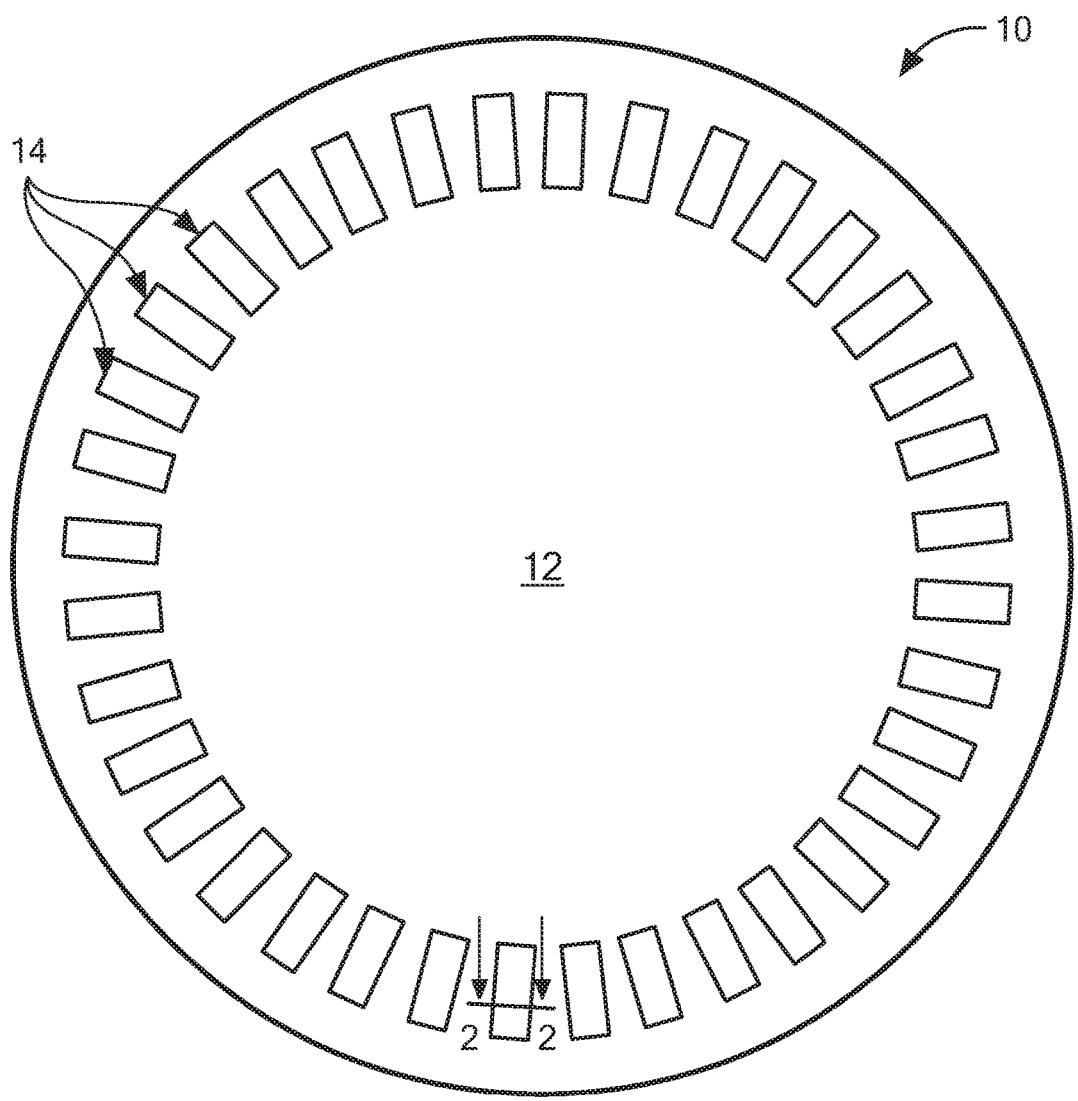
FIG. 1 is a top view of a magnetic field sensing device utilizing vertical Hall effect sensors.

FIG. 1 is a top view of Hall sensor device 10. Hall sensor device 10 includes semiconductor wafer 12 and vertical Hall effect sensors 14. Hall sensor device 10 is a device capable of sensing magnetic fields. For example, Hall sensor device 10 is capable of sensing magnetic fields in any direction in the plane including vertical Hall effect sensors 14. Semiconductor wafer 12 is a piece of semiconducting material, for example a wafer cut from a silicon boule. Semiconductor wafer 12 may be doped to be N-type or P-type, for example by using a phosphorous dopant to add charge carriers to a silicon wafer. Semiconductor wafer 12 may vary widely in size depending on the intended use of Hall sensor device 10. Typical sizes for vertical Hall sensors may be in the millimeter to micrometer range. The thickness of semiconductor wafer 12 affects maximum possible depth of current flow, and is often in the micrometer range. For example, it is very typical for a semiconductor wafer to be about 600 microns thick. However, only the top, epitaxial portion is important for the Hall sensor. This epitaxial portion is in the micrometer range, and could be as thin as perhaps 0.3 microns or as thick as perhaps 200 microns. In one particular example, the thickness of the epitaxial portion is about 7 microns. Semiconductor wafer 12 may be formed in alternative geometries.

While semiconductor wafer 12 as shown in FIG. 1 is a right cylinder, alternative geometries for semiconductor wafer 12 may include rectangular prisms or parallelograms. Semiconductor wafer 12 has an epitaxial portion, which includes all of semiconductor wafer 12 that is not doped as an electrode (FIGS. 2-3: 118, 120A-120B, 122A-122B), an implant layer (FIG. 3, 228), or a semiconductor finger (FIG. 2, 124A-124D). Doping levels within the epitaxial portion of semiconductor wafer 12 may be modified in order to facilitate desired current flow. For example, retrograde dopant profiles may be used, in which the dopant level of semiconductor wafer 12 is increased or decreased with depth beneath the surface of semiconductor wafer 12 on which vertical Hall effect sensors 14 are arranged. This retrograde dopant profile may be beneficial in that it may be used to increase or decrease the depth at which current flows through semiconductor wafer 12. Preferred paths for electrons flowing within semiconductor wafer 12 may be created by selectively doping regions of semiconductor wafer 12 with higher and lower levels of dopant, which modifies the charge carrier density therein. Modification of the charge carrier density affects resistivity of semiconductor materials.

In one example, vertical Hall effect sensors 14 are modified vertical Hall effect sensors vertical Hall effect detectors vertical Hall effect sensors 14 are typically made of a semiconductor material with various doping levels in different regions based on desired characteristics of Hall sensor device 10. In Hall sensor device 10 as shown in FIG. 1, there are thirty-six vertical Hall effect sensors 14. In alternative embodiments, there may be more or fewer vertical Hall effect sensors 14, depending on the desired output from Hall sensor device 10. For example, alternative Hall sensor devices may only require one Hall feature, or may utilize several thousand vertical Hall effect sensors, or any number in between vertical Hall effect sensors 14 are modified in order to increase the linearity and/or magnitude of the electrical signal produced in response to a magnetic field.

Hall sensor device 10 is made up of semiconductor wafer 12 with vertical Hall effect sensors 14 built into at least one of its surfaces. Electrodes (shown in FIG. 2) may be connected in such a way that the output from each of vertical. Hall effect sensors 14 may be measured, and the direction and strength of a magnetic field through Hall sensor device 10 may be determined. Semiconductor wafer 12 may be any wafer of semiconductive material, for example silicon. Often, the wafer is grown epitaxially, to facilitate the fabrication of regions with different doping levels. vertical Hall effect sensors 14 may be electrically connected to a meter (not shown) for data output, and in alternative embodiments may be either electrically connected to one another or electrically insulated from one another.

In use, Hall sensor device 10 can be used to measure the strength and direction of magnetic fields within the plane containing vertical Hall effect sensors 14 arranged in a circle as shown in FIG. 1. Each Vertical Hall effect sensor 14 can measure the strength of the magnetic field in one direction. In the embodiment shown in FIG. 1, each Vertical Hall effect sensor 14 is arranged such that it can measure the field in a direction radially inward to or outward from the center of semiconductor wafer 12. Various alternate configurations will be recognized by those skilled in the art. vertical Hall effect sensors 14 measure the strength of the magnetic field using Hall effect physics; thus, as the direction of the magnetic field being measured becomes perpendicular to the radially inner face of any Vertical Hall effect sensor 14, the difference between the outputs from that Hall vertical Hall effect sensor 14 will increase. Conversely, as the direction of the magnetic field being measured becomes parallel to the radially inner face of any Hall vertical Hall effect sensor 14, the difference between the outputs from that Hall vertical Hall effect sensor 14 will decrease.

An important aspect of Hall sensor device 10 is the modification of vertical Hall effect sensors 14. The modifications to vertical Hall effect sensors 14, as will be described with respect to FIGS. 2 and 3, allow for greater accuracy of Hall sensor device 10.

Figure 2:
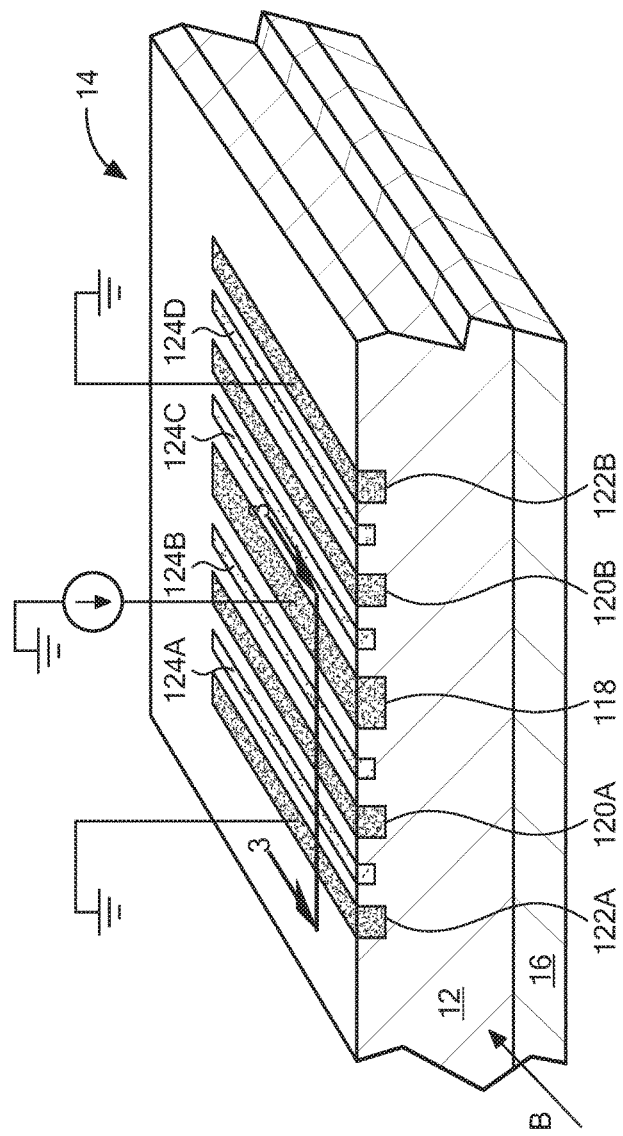
FIG. 2 is a perspective cut-away view of a vertical Hall effect sensor along line 2-2.

FIG. 2 is a cross-sectional view of vertical Hall effect sensor 14 taken along line 2-2 of FIG. 1. FIG. 2 shows semiconductor wafer 12 and isolation layer 16, as well as vertical Hall effect sensor 14. vertical Hall effect sensor 14 includes source electrode 118, sense electrodes 120A and 120B, and drain electrodes 122A and 122B. vertical Hall effect sensor 14 further includes p-fingers 124A, 124B, 124C, and 124D. Semiconductor wafer 12 is any semiconductor layer, such as an N-type phosphorous doped silicon wafer. Isolation layer 16 is a layer of material which can prevent electrical current from flowing from source electrode 118 out of semiconductor wafer 12. For example, isolation layer 16 may be an insulator or a P-type semiconductor. Source electrode 118, sense electrodes 120A and 120B, and drain electrodes 122A and 122B are electrodes used for measuring magnetic field through vertical Hall effect sensor 14. These electrodes may be, for example, relatively heavily doped N-type semiconductor materials as compared to the dopant level in the epitaxial portion of semiconductor wafer 12. P-fingers 124A-124D, in contrast, are P-type regions arranged between sense, drain, and source electrodes. While FIG. 2 shows one potential configuration, those of skill in the art will recognize that in alternative embodiments the dopant type may be reversed; that is, the p-fingers could be made of N-type semiconductor material and the epitaxial portion of semiconductor wafer 12 as well as source electrode 118, sense electrodes 120A-120B, and drain electrodes 122A-122B may be P-type. For convenience and clarity, throughout this application the epitaxial semiconductor and electrodes are referred to as N-type, and the isolation layer and p-fingers are referred to as P-type.

As shown in FIG. 2, isolation layer 16 forms a substrate upon which semiconductor wafer 12 is arranged. On the surface of semiconductor wafer 12 that is opposite isolation layer 16, several features are formed. These features include source electrode 118, which as shown in FIG. 2 is a bar-shaped electrode which is positively biased from ground. In alternative embodiments, source electrode may be held at a specific voltage greater than the voltage at drain electrodes 122A-122B. Sense electrodes 120A and 120B are disposed along the same surface of semiconductor wafer 12, and are also bar shaped electrodes. Sense electrodes 120A and 120B are arranged on opposite sides of source electrode 118. Sense electrodes 120A and 120B are electrically connected to a meter that determines the extent to which current preferentially flows to each of sense electrodes 120A and 120B. P-finger 124B is arranged between source electrode 118 and sense electrode 120A, and p-finger 124C is arranged between source electrode 118 and sense electrode 120B. Each of p-fingers 124B and 124C are bar-shaped regions of P-type semiconductor. Drain electrodes 122A and 122B are also N-type bar-shaped electrodes disposed along the same surface of semiconductor wafer 12 as source electrode 118, sense electrodes 120A-120B, and p-fingers 124B-124C. Drain electrode 122A is arranged opposite sense electrode 120A from source electrode 118, and drain electrode 122B is arranged opposite sense electrode 120B from source electrode 118. P-finger 124A is arranged between drain electrode 122A and sense electrode 120A, and p-finger 124D is arranged between drain electrode 122B and sense electrode 120B. Drain electrodes 122A-122B are connected to ground. In alternative embodiments, drain electrodes 122A-122B and source electrode 118 may be kept at a constant voltage, so long as there is a voltage difference between source electrode 118 and drain electrodes 122A-122B. An example of a magnetic field is also shown as magnetic field B.

Vertical Hall effect sensor 14 as shown in FIG. 2 utilizes Hall effect physics to measure magnetic field. In particular, magnetic fields within semiconductor wafer 12 cause current to flow preferentially to either drain electrode 122A or 122B. In general, moving charged particles with a velocity $\vec{\mu}$ and a charge $q_0$ are subject to a force $\vec{F}_{Hall}$ in magnetic field $\vec{B}$, where $\vec{F}_{Hall} = q_0 \vec{\mu} \times \vec{B}$. Therefore, magnetic field B as shown in FIG. 2 would cause negative charge carriers moving from source electrode 118 toward isolation layer 16 to "drift" toward drain electrode 122B. A magnetic field in the opposite direction of magnetic field B would cause negative charge carriers to preferentially drift toward drain electrode 122A, and a magnetic field perpendicular to B would cause no preferential drift, so the voltage at sense electrode 120A would be roughly equivalent to the voltage at sense electrode 120B. The deeper the current flows through semiconductor wafer 12, the greater the Hall effect on the moving charges, and the greater preferential drift towards either drain electrode 122A or drain electrode 122B. This preferential drift causes the voltage at sense electrodes 120A-120B to vary depending on magnetic field. P-fingers 124A-124D create depletion regions (FIG. 3, 226) between source electrode 118, sense electrodes 120A-120B, and drain electrodes 122A-122B.

While the diagram in FIG. 2 is not necessarily to scale, it should be noted that p-fingers 124A-124D are floated, as opposed to grounded. This makes the depletion region surrounding p-fingers 124A-124D smaller than in a configuration having grounded p-fingers. As a result, greater linearity of the output with respect to increased magnetic field is achieved. Further, P-fingers 124A-124D are narrower than the P-type regions used previously in vertical Hall devices. P-fingers 124A-124D may be, for example, between 0.5 micrometers and 1.2 micrometers in width, or more particularly between 0.6 micrometers and 0.8 micrometers in width, or even more particularly between 0.6 and 0.7 micrometers in width, for a semiconductor wafer that is 10 micrometers thick. Both of these changes —narrowing P-fingers 124A-124D and floating them as opposed to grounding them —result in increased linearity of the output from vertical Hall effect sensor 14. Both of these changes would, without further modifications to vertical Hall effect sensor 14, result in shallower current flow depth, which, as previously described, would result in less signal output with greater linearity.

Figure 3:
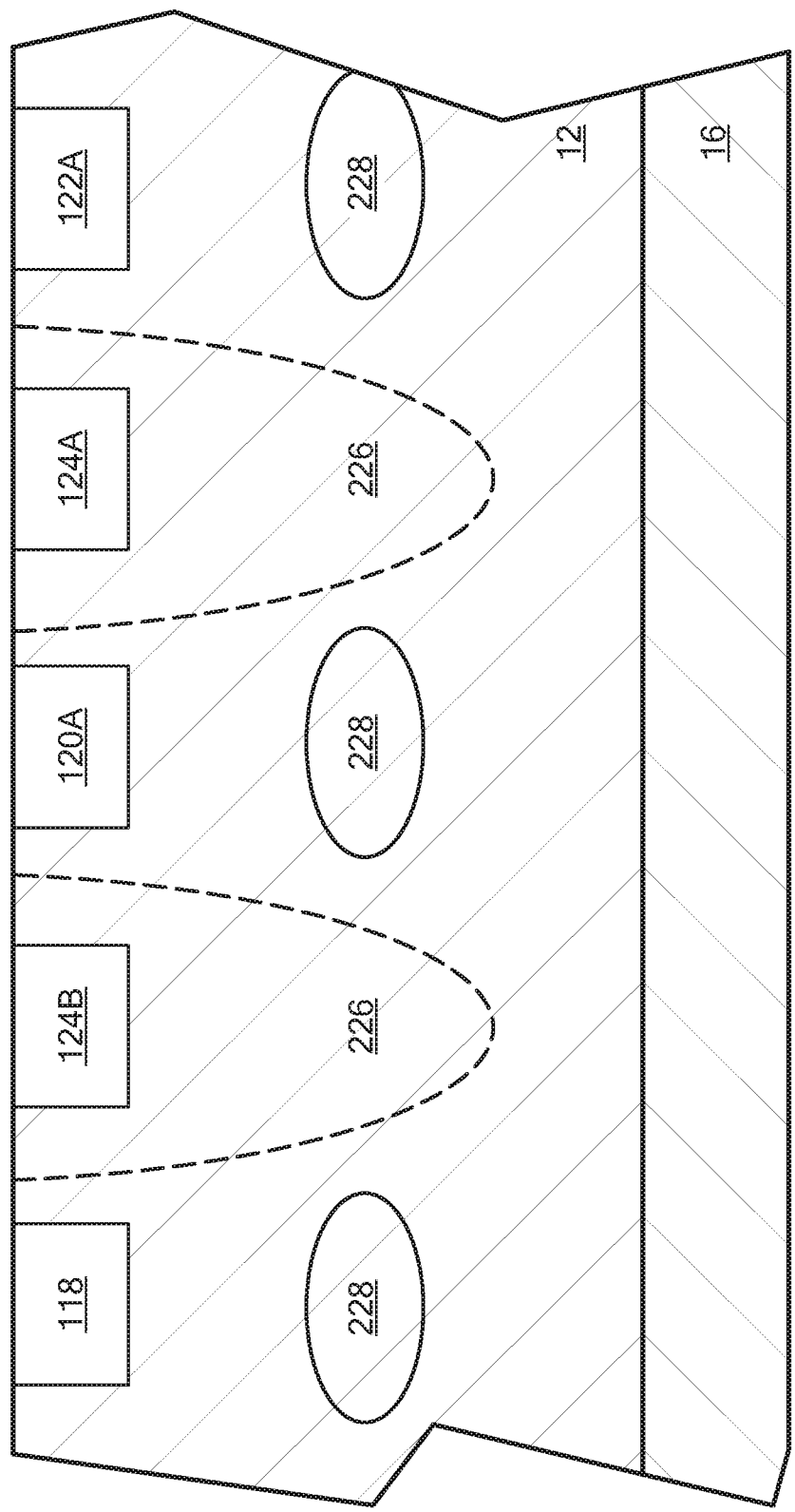
FIG. 3 is a cross-sectional view of a portion of a vertical Hall effect sensor along line 3-3.

FIG. 3 is a cross-sectional view of vertical Hall effect sensor 14 taken along line 3-3 of FIG. 2. FIG. 3 shows source electrode 118, sense electrode 120A, and drain electrode 122A. As in FIG. 2, p-fingers 124A and 124B are interdigitated between source electrode 219, sense electrode 120A, and drain electrode 122A. All of the electrodes and p-fingers are arranged within semiconductor wafer 12, which is arranged epitaxially on top of isolation layer 16. Additionally, FIG. 3 shows depletion region 226 and N-type blankets 228. N-type blankets 228 are regions with higher levels of N-type dopant than the surrounding epitaxial layers of semiconductor material 12. As such, N-type blankets 228 have higher charge carrier density and lower resistivity.

N-type blankets 228 shown in FIG. 3 are arranged within semiconductor wafer 12. The depth of N-type blankets 228 does not exceed the depth of depletion regions 226 which form around P-type fingers 124A-124B. Current preferentially flows through paths with the least resistance. Since N-type blankets 228 have higher charge carrier density and thus lower resistivity than the surrounding epitaxial portion of semiconductor material 12, current preferentially flows through N-type blankets 228 as opposed to areas with lower charge carrier density, such as the epitaxial region of semiconductor wafer 12. N-type blankets 228 therefore cause current flow to be deeper than it would otherwise flow. Depletion regions 226 have relatively high resistivity due to a lack of charge carriers, while N-type blankets 228 have relatively low resistivity due to a high concentration of charge carriers. Accordingly, charge prefers to flow through N-type blankets 228, which are arranged such that current flows downwards and around depletion regions 226. This deeper current flow, as previously described, results in higher signal levels than devices with shallow current flow.

In combination, N-type blankets 228 and narrow floating p-fingers 124A-124B create high levels of signal and increased linearity of such signal in response to increasing magnetic field, respectively. Both of these aspects are highly desired in magnetic field sensing devices such as vertical Hall effect sensing devices. Linearity of the signal allows for greater accuracy and precision in measurements. Deeper current flow and the associated high levels of signal are desirable for similar reasons; small percentage differences in output are more easily measurable when the overall output is larger.

Figures 4A, 4B, 4C:
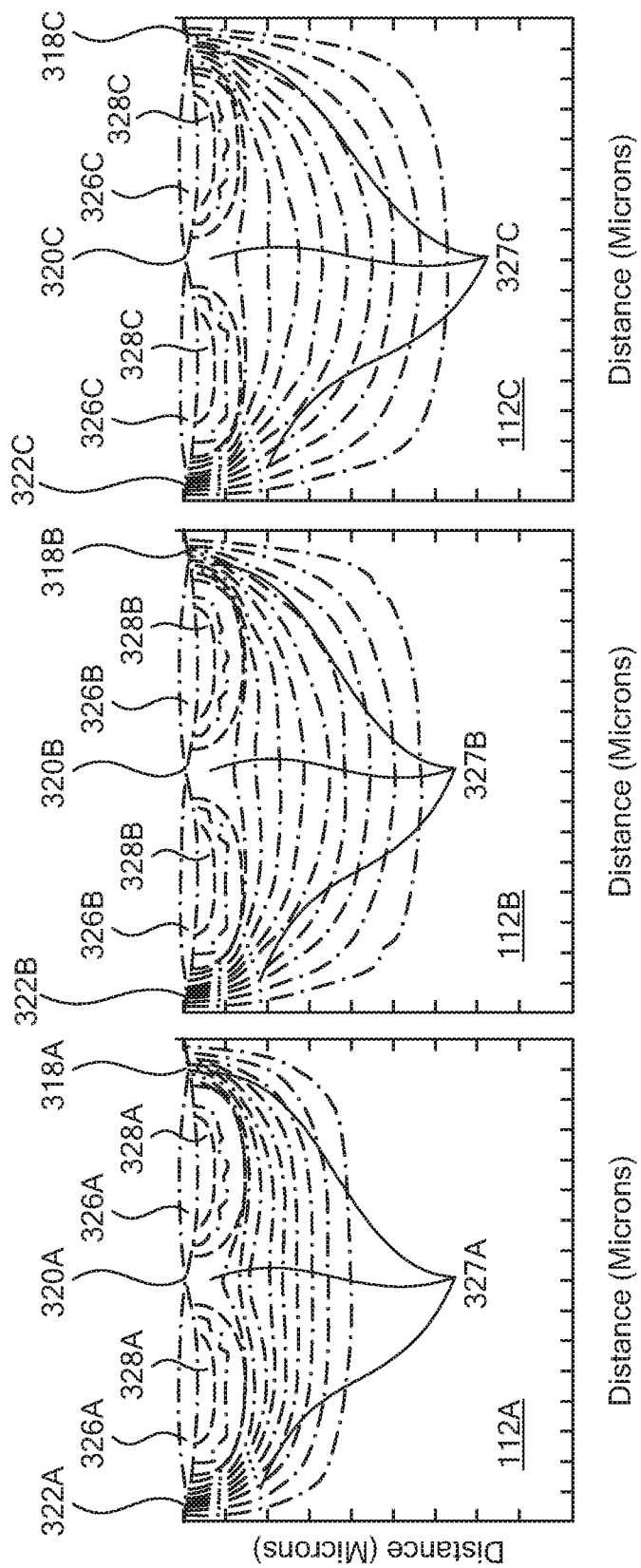
FIGS. 4A-4C are charts depicting equipotential lines in vertical Hall effect sensors.

FIGS. 4A-4C show equipotential lines in vertical Hall effect sensors (e.g., vertical Hall effect detectors). The data shown in FIGS. 4A-4C are based on modeled data, rather than actual test data. FIGS. 4A-4C are cross-sectional views of a Hall detector in operation, with equipotential lines superimposed. FIG. 4A includes source electrode 318A, sense electrode 320A, and drain electrode 322A, each of which is a semiconductor region which is more heavily doped than semiconductor wafer 112A. The embodiment shown in FIG. 4A also includes semiconductor fingers 326A, which are semiconductor regions with a conductivity type that is not the same as that of semiconductor wafer 112A. For example, if semiconductor wafer 112A is a p-type semiconductor wafer, then semiconductor fingers 326A would be made of n-type semiconductor material. Depletion region 328A is outlined. FIGS. 4B-4C includes similar parts to those shown in FIG. 4A, including semiconductor wafers 112B-112C, source electrodes 318B-318C, sense electrodes 320B-320C, drain electrodes 322B-322C, semiconductor fingers 326B-326C, and depletion regions 328B-328C. As in FIG. 4A, semiconductor wafer 112B, source electrode 318B, sense electrode 320B, and drain electrode 322B-322C are semiconductor regions with a first conductivity type, and semiconductor fingers 326B-326C are made of a semiconductor material with a second conductivity type. In contrast with FIG. 4A, FIGS. 4B-4C also include blanket implants 327B-327C. All three semiconductor wafers 112A-112C have the same level of dopant in their respective epitaxial (non-blanket implant) portions. Blanket implant 327C has a higher level of dopant than blanket implant 327B. Equipotential lines are shown as alternating dash-dot lines.

The order of source electrodes 318A-318C, sense electrodes 320A-320C, drain electrodes 322A-322C and semiconductor fingers 326A-326C follows the pattern described in previously described embodiments: sense electrodes 320A-320C are arranged between source electrodes 318A-318C and drain electrodes 322A-322C, and the electrodes are interdigitated with semiconductor fingers 326A-326C. In FIG. 4A, no blanket implants are present. In FIG. 4B, blanket layer 327B is present within semiconductor wafer 112B. In FIG. 4C, blanket layer 327C is present within semiconductor wafer 112C. Blanket implants 327B-327C are arranged within semiconductor wafers 112B and 112C, but do not extend as far beneath the surface of semiconductor wafers 112B and 112C as depletion regions 326B and 326C, respectively.

An electrical potential difference is provided between source electrodes 318A-318C and their associated drain electrodes 322A-322C. The voltage in semiconductor wafers 112A-112C varies by position based on the relative size and placement of blanket implants 327B-327C, the charge carrier density within the epitaxial (non-blanket implant) portion of semiconductor wafers 112A-112C, and the relative size and location of depletion regions 328A-328C.

By comparing the depth of the equipotential lines, the effect of blanket implants on current flow depth is observable. For example, the current flow depth in FIG. 4B is deeper than the current flow depth in FIG. 4A, and the current flow depth in FIG. 4C is deeper than the current flow depth in FIG. 4C. The change in current flow depth is attributable to the existence and/or doping level of blanket implants in each embodiment. Often, a larger current flow depth is desirable as a mechanism for increasing the output level of a Hall effect device.

Figure 5:
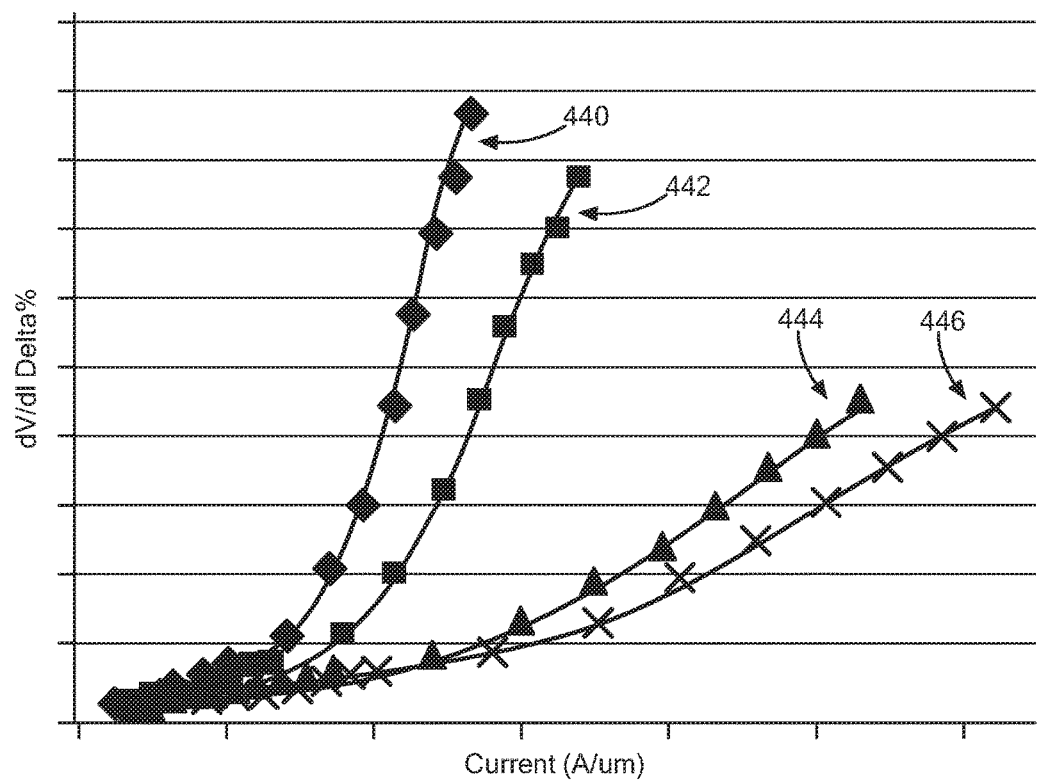
FIG. 5 is a chart depicting linearity of signal output of vertical Hall effect sensors.

FIG. 5 is a chart depicting linearity of signal output of vertical Hall effect sensors. The data shown in FIG. 5 is based on models of expected performance, and not on actual test data. dV/dI Delta % is a measure of the change in voltage output per change in current through the Hall effect sensor. Line 440 is the output curve for a vertical Hall effect sensor without a blanket implant and with grounded semiconductor fingers. Line 442 is the output curve for a vertical Hall effect sensor with a blanket implant at a first doping level, and grounded semiconductor fingers. Line 444 is the output curve for a vertical Hall effect sensor with a blanket implant at the first doping level, and electrically floated semiconductor fingers. Line 446 is the output curve for a vertical Hall effect sensor with a blanket implant at a second doping level that is greater than the doping level for the devices described in Line 442 and Line 444, and electrically floated semiconductor fingers.

Line 444 and Line 446 have much more linear output, in that the percent change in voltage over current increases more linearly with increasing current through the device. This type of linearity is desirable because it allows for greater accuracy and precision of measurements of an incident magnetic field. The differences between the output curves in FIG. 5 illustrate the effect of floating semiconductor fingers (as opposed to grounded semiconductor fingers) on the linearity of the output curve. Combined, FIG. 4 and FIG. 5 show that the depth of current flow and linearity of the output curve may both be maximized by combining blanket implants and electrically floated semiconductor fingers.

Elements of different embodiments described herein may be combined to form other embodiments not specifically set forth above. Other embodiments not specifically described herein are also within the scope of the following claims.

What is claimed is:

1. A magnetic field sensing device comprising:
    a plurality of vertical Hall effect sensors, each vertical Hall sensor comprising:
        a plurality of semiconductor electrodes; and
        a plurality of electrically floating semiconductor fingers interdigitated between the plurality of electrodes wherein the plurality of vertical Hall effect sensors is built within at least one surface of a semiconductor wafer and arranged in a circle, and
    wherein each vertical Hall effect sensor is configured to measure the magnetic field in a direction radially inward to or outward from a center of the semiconductor wafer,
    wherein the plurality of semiconductor electrodes comprising:
        a source electrode;
        a first sensing electrode and a second sensing electrode, arranged such that the source electrode is between the first sensing electrode and the second sensing electrode; and
        a first drain electrode and a second drain electrode, arranged such that the first sensing electrode, second sensing electrode, and source electrode are between the first drain electrode and the second drain electrode; and
    wherein the plurality of semiconductor fingers interdigitated with the plurality of semiconductor electrodes comprises a first semiconductor finger of the plurality of semiconductor fingers disposed between the source electrode and the first sensing electrode.

2. The sensing device of claim 1, wherein the semiconductor fingers are between one-tenth and two-tenths of the thickness of the semiconductor wafer.

3. The sensing device of claim 1, wherein the semiconductor wafer includes a retrograde dopant profile.

4. The sensing device of claim 1, wherein the floating semiconductor fingers are electrically connected to one another.

5. The sensing device of claim 1, wherein the plurality of semiconductor fingers interdigitated with the plurality of semiconductor electrodes further comprises a second semiconductor finger of the plurality of semiconductor fingers disposed between the source electrode and the second sensing electrode.

6. A method comprising:
    fabricating a vertical Hall effect sensor comprising:
        forming an epitaxial layer of a semiconductor with a first conductivity type on a semiconductor substrate with a second conductivity type;
        selectively doping at least five electrodes with the first conductivity type on a surface of the epitaxial layer;
        selectively doping at least four semiconductor fingers that are interdigitated with the at least five electrodes, the at least four semiconductor fingers having the second conductivity type, wherein the at least four semiconductor fingers interdigitated with the at least five electrodes comprises a first semiconductor finger of the at least semiconductor five fingers disposed between a source electrode and a first sensing electrode of the at least five electrodes; and
        selectively doping at least one blanket region with the first conductivity type within the epitaxial layer.

7. The method of claim 6, wherein selectively doping at least one blanket region within the epitaxial layer further comprises depositing an N-type dopant only along a preferred current path through the semiconductor substrate.

8. The method of claim 7, wherein the N-type dopant is phosphorous.

9. The method of claim 6, wherein the blanket region has a higher charge carrier density than the epitaxial layer.

10. The method of claim 6, wherein selectively doping at least four semiconductor fingers further comprises:
    depositing a P-type dopant only along a preferred region between any two N-type electrodes using a mask.

11. The method of claim 6, wherein forming the epitaxial layer of the semiconductor with the first conductivity type on the semiconductor substrate with the second conductivity type further comprises modifying a dopant level during epitaxial deposition in order to form a retrograde dopant profile.

12. The method of claim 6, further comprising electrically connecting the semiconductor fingers to each other.

13. The method of claim 6, further comprising electrically insulating the semiconductor fingers from one another.

* * * * *

UNITED STATES PATENT AND TRADEMARK OFFICE
CERTIFICATE OF CORRECTION

PATENT NO. : 9,735,345 B2
APPLICATION NO. : 15/060791
DATED : August 15, 2017
INVENTOR(S) : Steven Kosier et al.

It is certified that error appears in the above-identified patent and that said Letters Patent is hereby corrected as shown below:

On the Title Page

Item [57], Line 8, delete "and the sensing" and replace with --and the second sensing--

In the Specification

Column 1, Line 37, delete "the sensing electrode" and replace with --the second sensing electrode--

Column 2, Line 66-67, delete "sensors vertical Hall effect detectors vertical" and replace with --sensors. Vertical--

Column 3, Line 10, delete "between vertical" and replace with --between. Vertical--

Column 3, Line 16-17, delete "vertical. Hall" and replace with --vertical Hall--

Column 3, Line 22, delete "levels. vertical" and replace with --levels. Vertical--

Column 3, Line 36, delate "art. vertical" and replace with --art. Vertical--

Column 3, Line 41, delete "Hall vertical Hall" and replace with --vertical Hall--

Column 3, Line 44, delete "Hall vertical Hall" and replace with --vertical Hall--

Column 3, Line 45-46, delete "Hall vertical Hall" and replace with --vertical Hall--

Column 3, Line 55, delete "sensor 14. vertical" and replace with --sensor 14. Vertical--

Column 3, Line 57, delete "122B. vertical" and replace with --122B. Vertical--

Signed and Sealed this
Twentieth Day of November, 2018

Andrei Iancu
*Director of the United States Patent and Trademark Office*

Column 4, Line 57, delete "$\vec{\mu}$" and replace with --$\vec{v}$--

Column 4, Line 60, delete "$\vec{\mu}$" and replace with --$\vec{v}$--

Column 6, Line 24, delete "includes" and replace with --include--

Column 6, Line 30, delete "electrode" and replace with --electrodes--